US006812651B2

United States Patent
Iwata et al.

(10) Patent No.: US 6,812,651 B2
(45) Date of Patent: Nov. 2, 2004

(54) SPONTANEOUS LIGHT EMITTING DISPLAY DEVICE

(75) Inventors: Shuji Iwata, Tokyo (JP); Masashi Okabe, Tokyo (JP); Mitsuo Inoue, Tokyo (JP); Takashi Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 71 days.

(21) Appl. No.: 10/276,991

(22) PCT Filed: Mar. 15, 2002

(86) PCT No.: PCT/JP02/02495

§ 371 (c)(1),
(2), (4) Date: Nov. 20, 2002

(87) PCT Pub. No.: WO02/077957

PCT Pub. Date: Oct. 3, 2002

(65) Prior Publication Data

US 2003/0155866 A1 Aug. 21, 2003

(30) Foreign Application Priority Data

Mar. 22, 2001 (JP) .......................................... 2001-83514

(51) Int. Cl.$^7$ ................................................. G09G 3/10
(52) U.S. Cl. ................................ 315/169.3; 315/169.1; 345/90; 358/482
(58) Field of Search ........................... 315/169.1, 169.2, 315/169.3; 345/90, 94, 205; 358/482, 355; 250/208.1

(56) References Cited

U.S. PATENT DOCUMENTS

| 5,585,814 A | * | 12/1996 | Ueno et al. .................... 345/90 |
| 5,694,145 A | * | 12/1997 | Kondo et al. .................. 345/90 |
| 5,812,284 A | * | 9/1998 | Mizutani ...................... 358/482 |
| 6,404,137 B1 | | 6/2002 | Shodo ....................... 315/169.1 |
| 6,424,326 B2 | | 7/2002 | Yamazaki et al. ............. 345/77 |
| 6,452,341 B1 | | 9/2002 | Yamauchi et al. ........ 315/169.1 |
| 2002/0011972 A1 | | 1/2002 | Yamazaki et al. ............. 345/77 |

FOREIGN PATENT DOCUMENTS

| EP | 923 067 | 6/1999 |
| JP | 2001-56667 | 2/2001 |
| JP | 20001-67018 | 3/2001 |
| JP | 20001-75524 | 3/2001 |
| JP | 2001-265283 | 9/2001 |
| JP | 2001-292276 | 10/2001 |

\* cited by examiner

*Primary Examiner*—James Vannucci
*Assistant Examiner*—Jimmy T. Vu
(74) *Attorney, Agent, or Firm*—Leydig, Voit & Mayer, Ltd.

(57) ABSTRACT

A spontaneous light emitting display device with low power consumption suppresses fluctuation in characteristics of driving elements of light emitting pixels and has no fluctuation in light emitting luminance of a light emitting element. For each of light emitting pixels arranged in a matrix, a respective photoelectric converting portion detects light emitted from the corresponding light emitting pixels is provided, so that a current flowing to the light emitting pixels is controlled by using a voltage produced from the respective photoelectric converting portion. The device suppresses luminance variation of the light emitting pixel even when the conversion gain of the photoelectric portion varies.

4 Claims, 16 Drawing Sheets photoelectric conversion voltage

SPONTANEOUS LIGHT EMITTING DISPLAY DEVICE

TECHNICAL FIELD

The present invention relates to a spontaneous light emitting display device using an active matrix spontaneous light emitting element (a spontaneous light emission light emitting element) and having an excellent luminance uniformity and a lowered power consumption.

BACKGROUND ART

As a spontaneous light emitting display device, for example, an organic EL display using an organic EL (a spontaneous light emitting light emitting element) for a display panel has reached a practical level. The organic EL will be described below. Since the organic EL display has excellent features which cannot be obtained by a liquid crystal display, for example, spontaneous light emission, high-speed response and wide angle of view, it is expected to be a flat panel display which can produce clear characters and graphic images in a dynamic image display. The organic EL display can be operated in a passive matrix (PM mode) and an active matrix (AM mode) depending on a driving method.

The PM type is provided with a driving circuit outside of an organic EL panel and the structure of the organic EL panel itself can be therefore simplified and cost can be reduced. At present, the PM type organic EL panel is manufactured as a product and is used for a vehicle or a mobile telephone. The organic EL is a current driving element. In order to eliminate variation in luminance of the organic EL panel, therefore, it is necessary to cause a current flowing to each light emitting pixel to have an equal magnitude. However, it is hard to have an equal current, and furthermore, to reduce power consumption due to the following problems A to C.

A. In order to cause luminance of all pixels to be uniform, the current flowing to each of the pixels is to be equal. For this reason, it is necessary to cause one of the positive and negative electrodes of each pixel to act as a constant current source. In order to operate the electrode as the constant current source, however, the driving voltage of a matrix electrode on the other side is to be increased such that a voltage drop caused by the resistance component of a bus line has no influence. Consequently, a power consumption is increased. In the case in which a driving voltage cannot be increased sufficiently, a voltage drop corresponding to a bus line length to reach each pixel influences a current amount for light emission. More specifically, the constant current source is not obtained so that a variation in luminance is caused.

B. In order to obtain a predetermined surface luminance, the PM type needs to emit a light with an N-fold instantaneous luminance if the number of scanning lines of the display panel is N. Since a current flowing to the pixel is usually proportional to a light emission luminance, the current to flow becomes N-fold. Since the organic EL has such a feature that a light emission efficiency is reduced if a current to flow is increased, however, an N-fold pixel current or more is required for obtaining the predetermined surface luminance. Thus, the power consumption is increased if the number N of the scanning lines is increased. This problem increasingly promotes the problem A.

C. Since the organic EL panel has a surface structure, a capacitive load is connected to each element in parallel as an equivalent circuit. When a pixel current is increased or the number of pixels is increased so that a repetitive frequency is increased, the magnitude of a charging and discharging current to flow to the capacitive load is made great so that a power consumption is increased. Due to the problem B, the power consumption of the capacitive load is considerably increased in the PM type. Due to the above problem, the PM type which is currently manufactured as a product has a screen size of several inches or less and a pixel number of 10,000-pixel level.

In the AM type organic EL panel, the above problems can be improved. In the above problem A, the AM type has a TFT driving circuit provided in each pixel. Therefore, it is not necessary to cause a large current to flow instantaneously. As a result, a voltage drop caused by a bus line in the above problem A is decreased and an applied voltage can be reduced. Consequently, the power consumption can be reduced more considerably than that of the PM type.

Since the applied voltage can be reduced, a slightly high applied voltage is simply set so that a voltage drop corresponding to a bus line length to each pixel does not influence on a pixel current amount. Consequently, an uniform luminance can be obtained. In the above problem B, the AM type has a TFT driving circuit provided in each pixel. Therefore, it is sufficient that a small pixel current always flows irrespective of the number N of the scanning lines. Therefore, there can be avoided increase of power consumption due to reduction in light emission efficiency with an increase in a pixel current. In the problem C, since the AM type has the TFT driving circuit provided in each pixel, it is sufficient that a small pixel current flows irrespective of the number N of the scanning lines. Therefore, a charging and discharging current flowing to the capacitive load can be reduced. Consequently, the power consumption can be reduced. Thus, the AM type organic EL panel can reduce a variation in luminance and a power consumption. However, the AM type has the following great drawback. More specifically, it is hard to fabricate a driving element having a uniform characteristic over the whole organic EL panel area. As a result, a current value flowing to each pixel is different so that a luminance is varied. FIG. 12 shows a driving circuit for causing a pixel in a conventional AM type organic EL panel to emit a light which has been described in Japanese Patent Publication No. 2784615, for example.

An operation will be described below with reference to FIG. 12.

Reference numeral 80 denotes a FET constituted by an N channel type and is operated as a switching element. Reference numeral 81 denotes an FET constituted by a P channel and is operated as a driving element. The FETs 80 and 81 are formed of low temperature polysilicon. A capacitor 82 is a capacitive load connected to the drain terminal of the FET 80. An organic EL element 83 to be an light emitting pixel is connected to the drain terminal of the FET 81. The drain terminal of the FET 80 is connected to the gate terminal of the FET 81. A scanning signal is applied from a scanning line 84 to the gate terminal of the FET 80. An image signal is applied from a data line 85 to the source terminal of the FET 80. Reference numeral 86 denotes a voltage supply line for supplying a voltage to the organic EL element 83. First of all, a scanning signal is applied to the gate terminal of the FET 80. At this time, when an image signal is applied at a predetermined voltage to the source terminal, the capacitor 82 of the drain terminal of the FET 80 is held to have a voltage level V1 corresponding to the magnitude of an image signal. If the magnitude of the voltage level V1 (shown in FIG. 13) held to have the gate voltage of the FET 81 is enough for causing a drain current to flow, a current corresponding to the magnitude of the voltage level V1 flows to the drain of the FET 81. The drain current becomes a light emitting current for a pixel. The luminance of the pixel is proportional to the magnitude of the light emitting current.

FIG. 13 is a characteristic chart for explaining the generation of a luminance variation in a pixel when a light emission is carried out by such an operation. The characteristic chart shows the relationship between a gate—source voltage and a drain current of the FET 81. In the case in which the FET 80 and the FET 81 are formed of the low temperature polysilicon, it is hard to obtain an FET having the same characteristic over the whole display panel area in respect of manufacturing method of a low temperature polysilicon. For example, each of the FET 80 and the FET 81 has a variation in characteristic shown in FIG. 13. When the voltage level V1 is applied to the FET 81 having such a characteristic, the magnitude of the drain current is varied in a range of Ia to Ib. Since the organic EL emits a light with a luminance which is proportional to the magnitude of the current, the characteristic of the FET 81 represents a variation in light emission luminance. In particular, the variation in characteristic shown in FIG. 13 cannot prevent the generation of the luminance variation in a method of modulating a luminance in an analog amount, that is, a method of controlling a light emission luminance with the magnitude of the voltage level V1. In a digital luminance control method for controlling a luminance at a level in which the voltage level V1 shown in FIG. 14 always has a constant value, therefore, a level in which a current is saturated is used. Consequently, it is possible to prevent a luminance variation generated in an analog luminance control method.

In the case of a characteristic having the relationship between the gate—source voltage and the drain current of the FET 81 shown in FIG. 15, however, a saturation current is not equal. Also in the digital luminance control method, therefore, a luminance variation is generated. Thus, it is difficult to prevent the luminance variation by the characteristic variation of a driving element in the conventional driving circuit.

FIG. 16 shows a driving circuit described in "Active Matrix OELD Displays with Po-SiTFT. The 10th International Workshop on Inorganic & OEL. P. 347 to P. 356" as a conventional example in which the characteristic variation of the driving element is improved. In this conventional example, the FET 81 to be a driving element shown in FIG. 8 is set to be an FET 81A and an FET 81B, and there has been disclosed a structure in which these FETs are connected in parallel with each other to average the characteristic variation. Also in such a structure, it is very hard to prevent the generation of the characteristic variation in the driving element.

In the conventional spontaneous light emitting type display device, there has not been solved the problem in which the light emission luminance of a light emitting element constituting a pixel caused by the characteristic variation of the driving element is varied as described above.

The present invention solves the above-mentioned problems and provides a spontaneous light emitting type display device having no luminance variation in a pixel and a low power consumption.

DISCLOSURE OF INVENTION

A spontaneous light emitting type display device according to a first aspect of the present invention comprises a plurality of light emitting pixels arranged in a matrix state, a photoelectric converting portion provided for each light emitting pixel and serving to receive a light emitted from the light emitting pixel, and a control circuit for controlling a current flowing to the light emitting pixel by using a voltage obtained from the photoelectric converting portion.

According to such a structure, even if a variation in current is generated in a driving element, it is possible to suppress a luminance variation in the light emitting pixel.

A spontaneous light emitting type display device according to a second aspect of the present invention is characterized in that, in the spontaneous light emitting type display device according to the first aspect of the present invention, the control circuit includes a voltage and current converting portion and a current adding and subtracting portion.

According to such a structure, even if a variation in current is generated in a driving element, it is possible to suppress a luminance variation in the light emitting pixel.

A spontaneous light emitting type display device according to a third aspect of the present invention is characterized in that, in the spontaneous light emitting type display device according to the first aspect of the present invention, the device includes a voltage converting portion provided on an output side of the photoelectric converting portion, and means for controlling a current flowing to the light emitting pixel by using a voltage obtained from the voltage converting portion.

According to such a structure, it is possible to suppress a fluctuation in the luminance of the light emitting element due to a change in the conversion gain of the photoelectric converting portion.

A spontaneous light emitting type display device according to a fourth aspect of the present invention is characterized in that, in the spontaneous light emitting type display device according to the third aspect of the present invention, an output voltage of a voltage converting portion is controlled such that magnitudes of the output voltage and an image signal for controlling the light emitting pixel correspond to each other with one to one.

According to such a structure, it is possible to suppress a fluctuation in the luminance of the light emitting element due to a change in the conversion gain of the photoelectric converting portion.

BEST MODE FOR CARRYING OUT THE INVENTION

Figure 1:
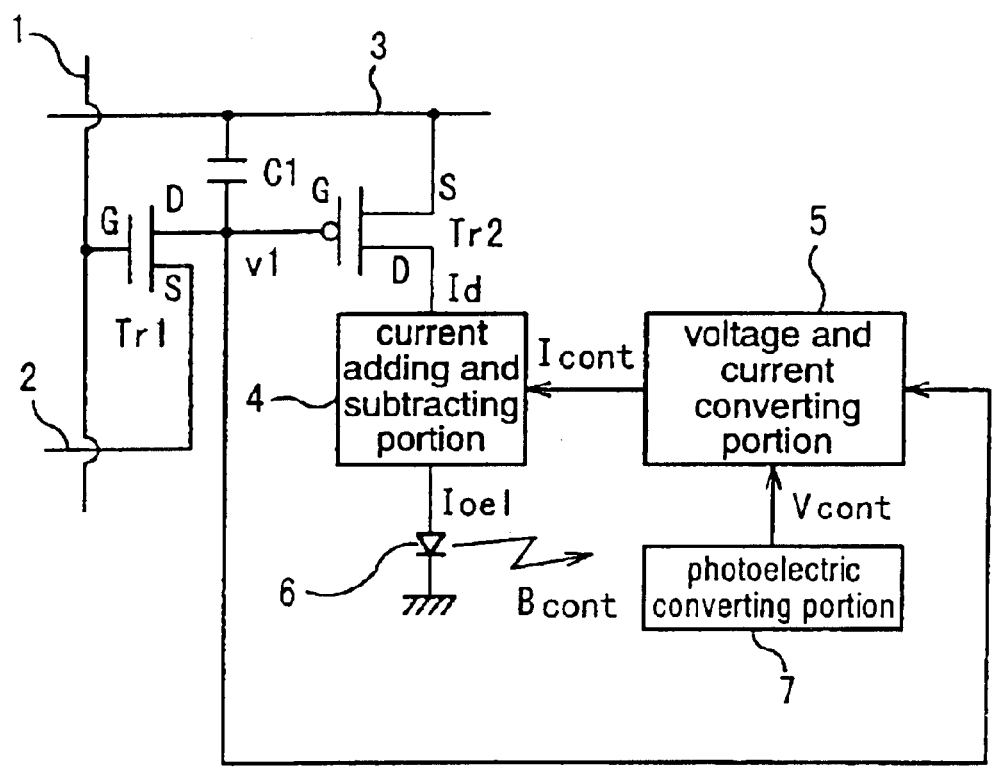
FIG. 1 is a circuit diagram showing a driving circuit according to Embodiment 1 of the present invention.

Embodiments of the present invention will be described below with reference to the drawings. In the drawings, the same reference numerals denote the same or corresponding portions.

Embodiment 1

FIG. 1 is a circuit diagram showing a driving circuit according to Embodiment 1 of the present invention. In the drawing, Tr1 denotes a switching element and is an N channel type FET. Tr2 denotes a driving element and is a P channel type FET. These FETs are formed of low temperature polysilicon. A scanning signal is applied to a gate terminal G of an FET Tr1 through a scanning line 1. An image signal is applied from a data line 2 to a source terminal S. When a scanning ling signal is applied to a gate terminal and an image signal is applied at a predetermined voltage to the source terminal S, a capacitor C1 connected to a drain terminal D of the switching element Tr1 is charged to a voltage level V1 corresponding to the magnitude of an image signal and a voltage thereof is held. If the magnitude of the voltage level V1 held to be the gate voltage of the driving element Tr2 is enough for causing the drain current of the driving element Tr2 to flow, a current Id corresponding to the magnitude of the voltage level V1 flows to the drain D of the driving element Tr2. A drain current Id is input to a current adding and subtracting portion 4. A control current Icont output from a voltage and current converting portion 5 is input to another terminal of the current adding and subtracting portion 4. The magnitude of a pixel current Ioel output from the current adding and subtracting portion 4 is obtained by adding and subtracting the drain current Id and the control current Icont.

When the pixel current Ioel flows to a light emitting element 6, the light emitting element 6 emits a light with a luminance which is proportional to the magnitude. The light emitting element 6 comprises an organic EL to be a spontaneous light emitting type light emitting element. A part of the light emitted from the light emitting element 6 is input as a photoelectric conversion light Bcont to a photoelectric converting portion 7. When the light emitted from the light emitting element 6 hits on the photoelectric converting portion 7, an electromotive force is generated so that the photoelectric converting portion 7 can convert the received light into an amount of electricity. The photoelectric converting portion 7 comprises amorphous silicon, for example. In the photoelectric converting portion 7, a current conversion voltage Vcont corresponding to the magnitude of the photoelectric conversion light Bcont is output. In the voltage and current converting portion 5, a control current Icont corresponding to the magnitude of the input current conversion voltage Vcont is output. Another terminal of the voltage and current converting portion 5 is connected to the gate terminal G of the driving element Tr2. A voltage level V1 corresponding to the magnitude of a pixel signal is applied and the voltage and current converting portion 5 is operated to convert a difference in a magnitude between the input voltages into the control current Icont.

By such a structure, even if the characteristic of the driving element Tr2 has a variation, the pixel current Ioel flowing to the light emitting element 6 can be controlled by the control current Icont. Consequently, a brightness given from the light emitting element 6 can be always held to have a normal value.

For example, in the case in which voltage levels V1 having the same magnitude (which has an equal magnitude of a pixel signal) is applied to the gate G of the driving elements Tr2 having a different characteristic in different pixel positions on a display panel, the luminance of the light emitting element 6 is varied if the magnitude of the drain current Id in each of the driving elements Tr2 is different. The difference in the luminance is made to be a difference in the magnitude of the photoelectric conversion light Bcont obtained from the light emitting element 6 because the photoelectric conversion light Bcont input to the photoelectric converting portion 7 corresponds to the luminance of the light emitting element 6. In the photoelectric converting portion 7, a conversion into the photoelectric conversion voltage Vcont corresponding to the magnitude of the photoelectric conversion light Bcont is carried out. Therefore, the photoelectric conversion voltage Vcont corresponding to the magnitude of the luminance of the light emitting element 6 is obtained from the output of the photoelectric converting portion 7.

In the voltage and current converting portion 5, the voltage V1 corresponding to the magnitude of an image signal is compared with the magnitude of the photoelectric conversion voltage Vcont to generate a current corresponding to a difference thereof. In other words, a control signal Icont corresponding to the amount of the luminance variation of the light emitting element 6 is output from the voltage and current converting portion 5. Thus, a variation in a drain current caused by the characteristic variation of the driving element Tr2 can be controlled by the control current Icont. Consequently, the pixel current Ioel can be controlled to have such a magnitude as to depend on the voltage level V1 corresponding to the magnitude of the pixel signal. As a result, the luminance can be made equal.

Figure 2:
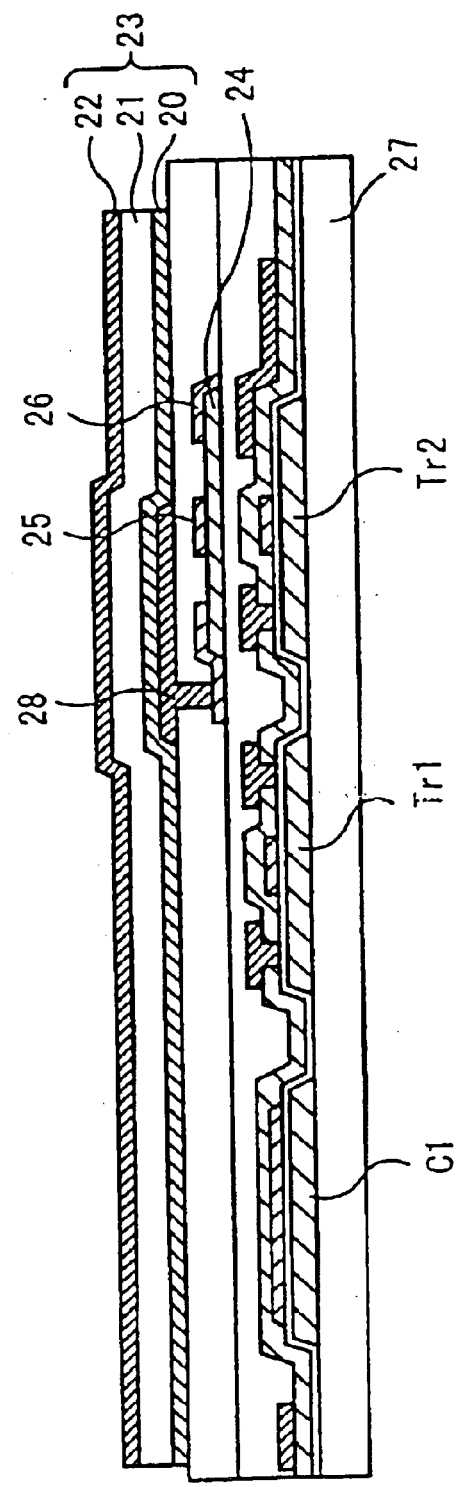
FIG. 2 is a sectional view showing the structure of the driving circuit according to Embodiment 1 of the present invention.

FIG. 2 is a sectional view typically showing a display panel, illustrating the structure of the photoelectric converting portion 7 for converting a light emitted from the light emitting element 6 into the photoelectric conversion voltage Vcont. The photoelectric converting portion 7 is provided in the pixel of the light emitting element 6 or in the vicinity thereof. The light emitting element 6 is formed of an organic EL light emitting member 23 comprising a hole transport layer 20, an organic EL layer 21 and an electron transport layer 22.

A photo-detecting element 24 is formed in the middle of the driving element Tr2 and the organic EL light emitting member 23. The photo-detecting element 24 is formed of amorphous silicon, for example. Since the photo-detecting element 24 receives a light from the organic EL light emitting member 23 and generates an electromotive force, the current conversion voltage Vcont corresponding to the luminance of the organic EL light emitting member 23 is obtained from a terminal 26 on one of the sides of the photo-detecting element 24 if a terminal 25 is set to have an electric potential to be a reference. The switching element Tr1, the driving element Tr2 and the capacitor C1 are formed on a transparent insulating substrate 27. Reference numeral 28 denotes a light shielding film. By employing such a structure that the photo-detecting element 24 is provided in the vicinity of a light emitting element, the light emitted from the organic EL light emitting member 23 is directly detected by the photo-detecting element 24. Consequently, it is possible to obtain the luminance information of the organic EL light emitting member 23, that is, the light emitting element 6 which includes the characteristic variation of the driving element Tr2. The luminance information is output to the voltage and current converting portion 5.

According to Embodiment 1 described above, even if the characteristic of the driving element Tr2 has a variation, the pixel current Ioel to flow to the light emitting element 6 can be controlled by the control current Icont and the brightness of the light emitting element can be always held to have a normal value. Thus, a variation in the luminance of a pixel can be prevented.

In the above description, the organic EL has been taken as a spontaneous light emitting type display element. Other elements can also offer the same effects.

Embodiment 2

Embodiment 2 of the present invention will be described below with reference to the drawings.

Figure 3:
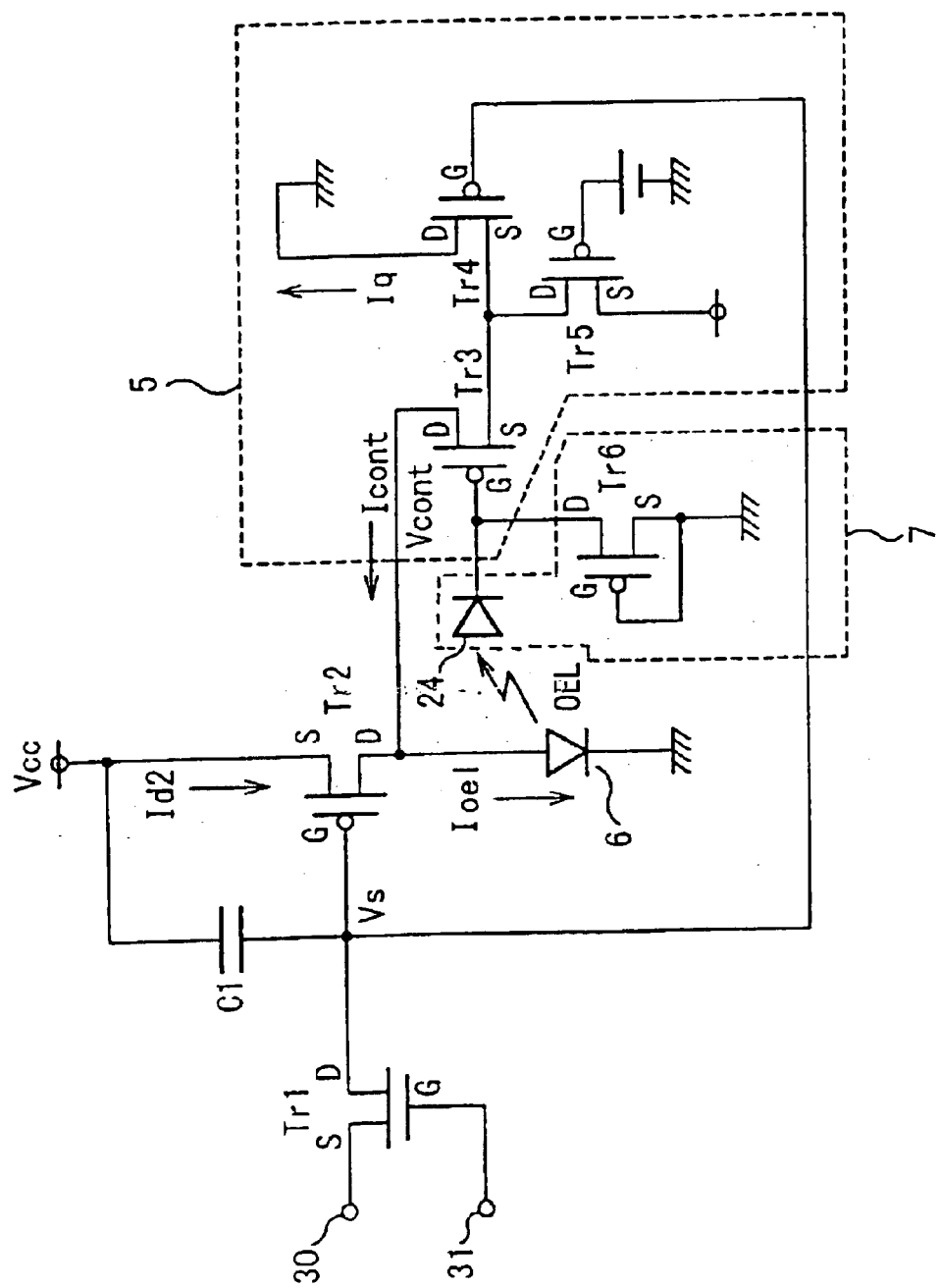
FIG. 3 is a sectional view showing a driving circuit according to Embodiment 2 of the present invention.

FIG. 3 is a circuit diagram showing the structure of a driving circuit according to Embodiment 2, specifically illustrating FIGS. 1 and 2. In the drawing, a terminal 30 is connected to a data line 2 and a terminal 31 is connected to a scanning line 1. A voltage and current converting portion 5 is formed by a differential amplifier comprising three FETs Tr3, Tr4 and Tr5. A photoelectric converting portion 7 comprises a photo detecting element 24 and an FET Tr6 for an equivalent resistance which is connected to a cathode thereof.

Figure 4:
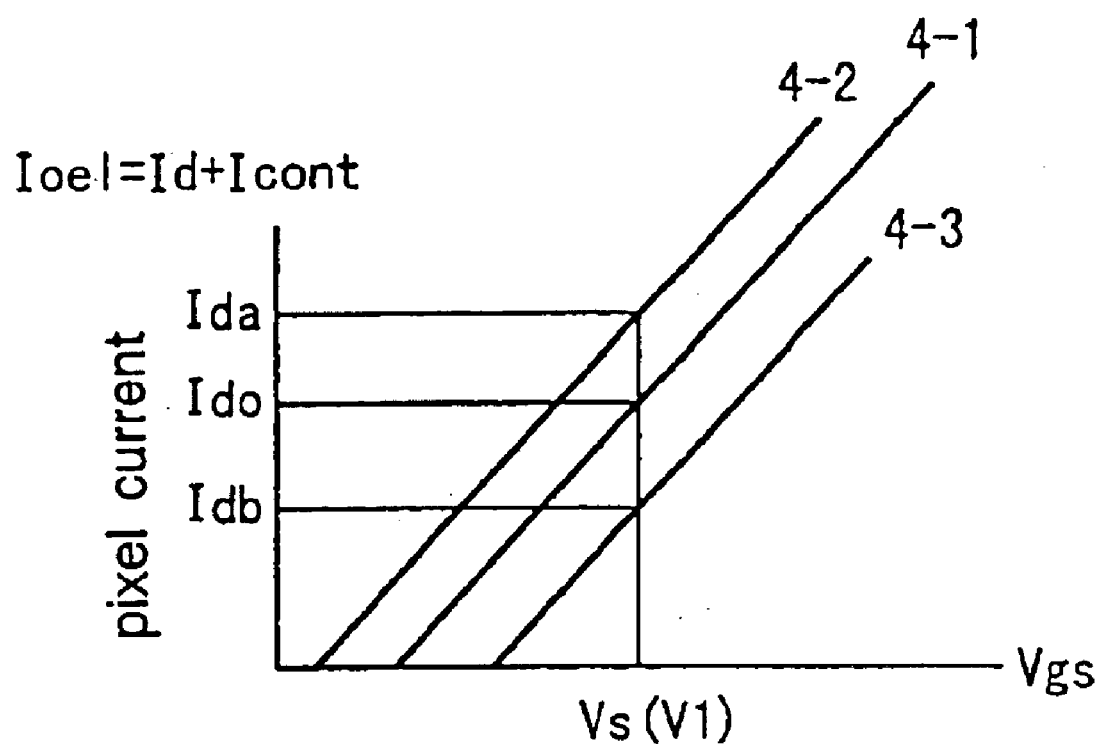
FIG. 4 is a characteristic chart for explaining Embodiment 2 of the present invention, showing the relationship between a voltage and a pixel current in a driving element.
Figure 5:
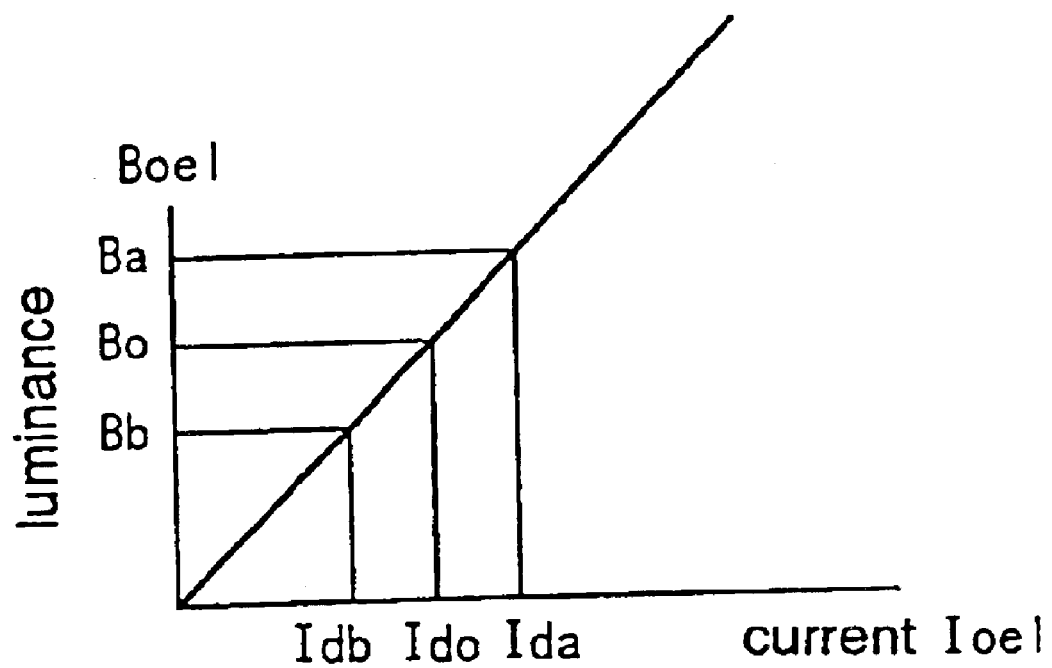
FIG. 5 is a characteristic chart for explaining Embodiment 2 of the present invention, showing the relationship between the pixel current and the luminance of a light emitting pixel.
Figure 6:
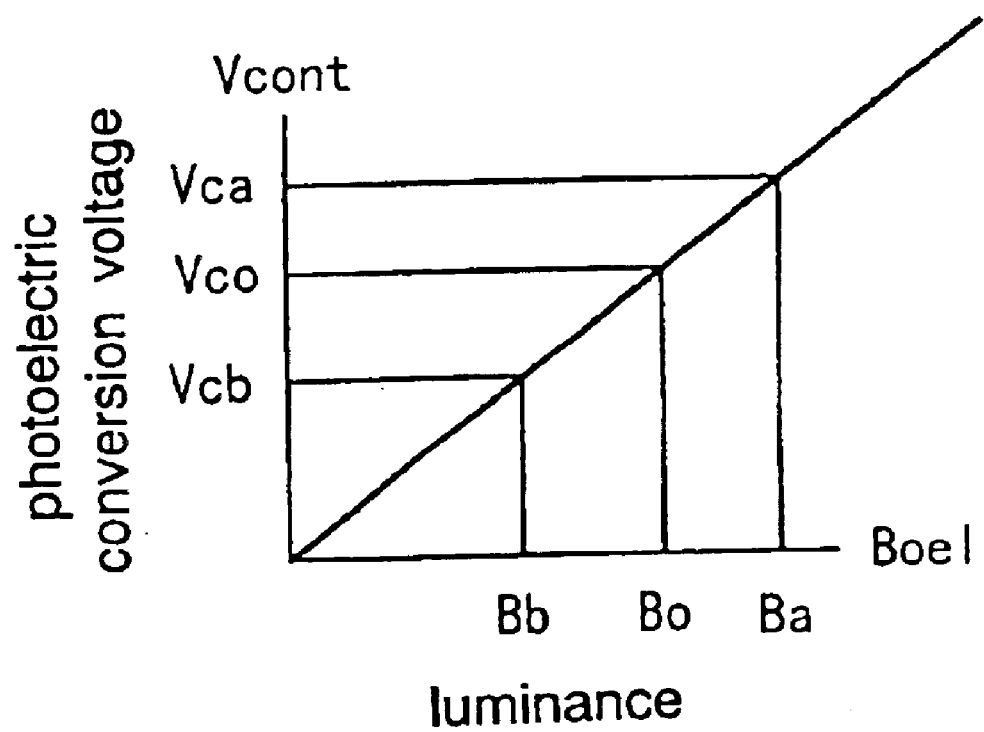
FIG. 6 is a characteristic chart for explaining Embodiment 2 of the present invention, showing the relationship between the luminance of a light emitting pixel and a photoelectric conversion voltage.
Figure 7:
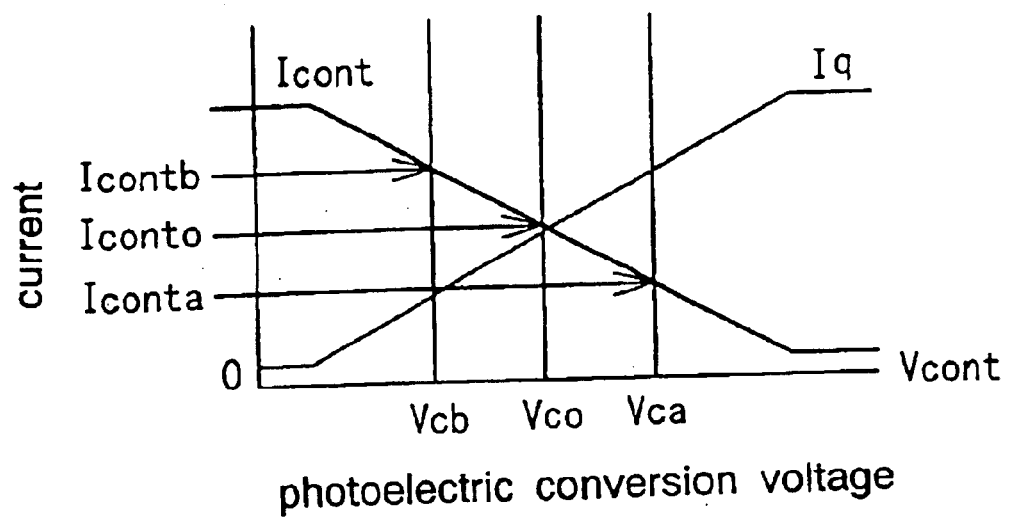
FIG. 7 is a characteristic chart for explaining Embodiment 2 of the present invention, showing the relationship between the photoelectric conversion voltage and a control voltage.

FIG. 4 is a current characteristic chart showing the relationship between a voltage V1 applied to the gate of a driving element Tr2 and a pixel current Ioel. FIG. 4 shows three kinds of varied pixel current characteristics 4-1 to 4-3. FIG. 5 is a characteristic chart showing the relationship between a pixel current Ioel and a light emission luminance Boel. FIG. 6 is a characteristic chart showing the relationship between an amount (luminance) of a light received by the photoelectric converting portion 7 and a photoelectric conversion voltage Vcont. FIG. 7 is a characteristic chart showing the relationship between the photoelectric conversion voltage Vcont and a control current Icont. The control of a luminance variation will be described below with reference to FIGS. 3 to 7.

In FIG. 3, the control current Icont output from the voltage and current converting portion 5 flows into the anode terminal of the light emitting element 6 so that an anode current Ioel has a magnitude obtained by adding a drain current Id and the control current Icont. The added current becomes the pixel current Ioel of the light emitting element 6. The pixel current Ioel flows to the light emitting current 6 so that the light emitting element 6 emits a light with a luminance which is proportional to the magnitude of the pixel current Ioel. A part of the light emitted from the light emitting element 6 is input as a photoelectric conversion light Bcont to the photoelectric converting portion 7. The photoelectric converting portion 7 comprises the photo-detecting element 24, the terminal 25 and the terminal 26 as shown in FIG. 2. In the photoelectric converting portion 7, the current conversion voltage Vcont corresponding to the magnitude of the photoelectric conversion light Bcont is output. The control current Icont corresponding to a difference between the magnitude of the input current conversion voltage Vcont and the magnitude of a voltage applied to a gate terminal G of the FET Tr4 is output from the voltage and current converting portion 5.

As shown in FIG. 4, it is assumed that a voltage V1 is applied to the gate terminal G of the driving element Tr2. The characteristic of the driving element Tr2 is set to be the characteristic 4-1 shown in FIG. 4. Referring to (the characteristic 4-1, the pixel current Ioel is the sum of the drain current Id and the control current Icont. As is apparent from FIG. 4, the pixel current Ioel is Ido. As is apparent from FIG. 5, the luminance of the light emitting element 6 has a value of Bo shown in FIG. 5 because the pixel current is Ido. As is apparent from FIG. 6, the photoelectric conversion voltage Vcont obtained from the photoelectric converting portion 7 is Vco shown in FIG. 6 because the light emission luminance of the light emitting element 6 is Bo.

As is apparent from FIG. 7, the drain current Icont of the FET Tr3 constituting a differential amplifier is Iconto shown in FIG. 7 because the photoelectric conversion voltage Vcont is Vco. When the voltage Vcont to be the gate voltage of the FET Tr3 constituting the differential amplifier is equal to the voltage V1 applied to the gate terminal of the other FET Tr4 constituting the differential amplifier, the characteristics of the current Icont and the drain current Iq in FIG. 7 are designed to cross with each other. For example, even if the same voltage V1 is applied to the gate terminal of the driving element Tr2, the pixel current Ioel flowing to the light emitting element 6 is Ida in the characteristic 4-2 shown in FIG. 4. The pixel current Ida is a value obtained by adding the drain current Id of the driving element Tr2 and the drain current Icont of the Tr3 constituting the differential amplifier. The current value to be the added value is set to be the pixel current Ioel of the light emitting element 6. Referring to the characteristic shown in FIG. 5, therefore, the luminance of the light emitting element 6 has a value indicated as Ba. As is apparent from FIG. 6, the photoelectric conversion voltage Vcont obtained from the photoelectric converting portion 7 is Vca because the light emission luminance of the light emitting element 6 is Ba. As is apparent from FIG. 7, the drain current Icont of the Tr3 constituting the differential amplifier is conta because the photoelectric conversion voltage Vcont is Vca. More specifically, the drain current Iconta of the Tr3 of the differential amplifier is smaller than Iconto. Therefore, the pixel current Ioel flowing into the light emitting element 6 is transferred in the direction of a decrease. Consequently, the luminance of the light emitting element 6 is reduced. In other words, the differential amplifier comprising Tr3 to Tr5 shown in FIG. 3 repeats a negative feedback operation until the gate voltages of the Tr3 and Tr4 become equal to each other. The Tr5 constitutes a constant current source.

According to Embodiment 2 described above, even if the characteristic of the driving element Tr2 has a variation, it is possible to always hold the brightness of the light emitting element to have a constant value by controlling the pixel current Ioel flowing to the light emitting element 6 through the control current Icont. Thus, it is possible to prevent the luminance variation of a pixel. Moreover, an active matrix type driving circuit is constituted. Therefore, it is possible to reduce the power consumption of the driving circuit.

Embodiment 3

Figure 8:
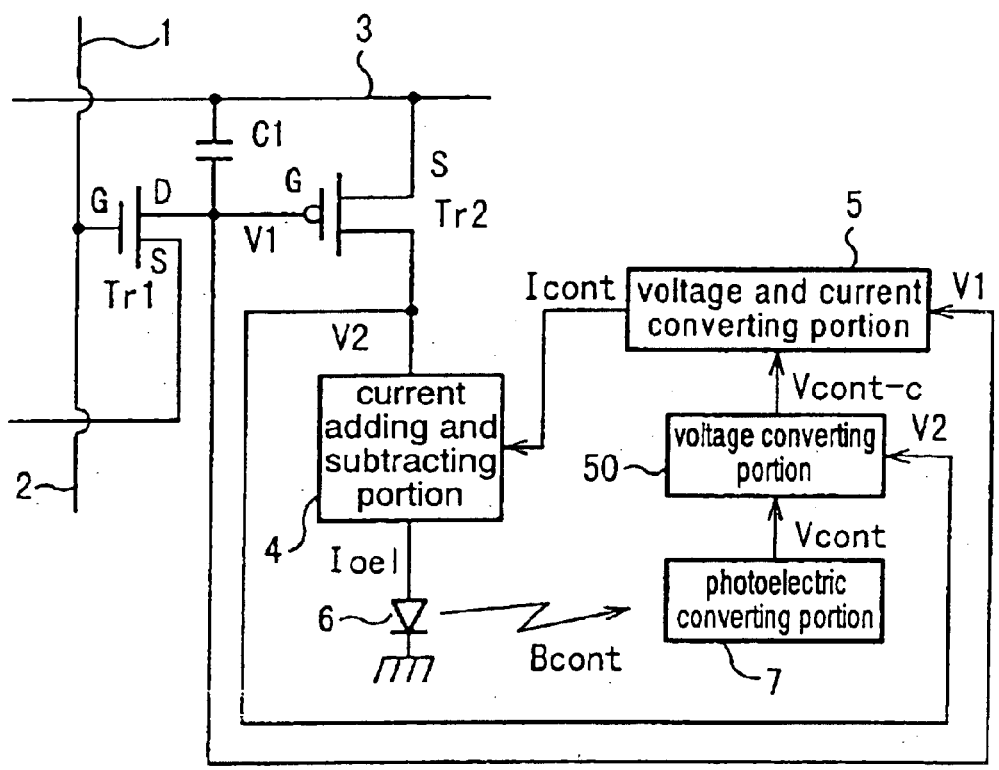
FIG. 8 is a block diagram for explaining Embodiment 3 of the present invention.

FIG. 8 is a circuit diagram showing a driving circuit according to Embodiment 3 of the present invention. Embodiment 3 will be described with reference to FIG. 8. First of all, in Embodiment 1, the convertion into the photoelectric conversion voltage Vcont corresponding to the magnitude of the photoelectric conversion light Bcont is carried out so that the pixel current Ioel flowing to the light emitting element 6 is controlled to always maintain the brightness of the light emitting element 6 to have a normal value by the control current Icont sent from the voltage and current converting portion 5, even if the characteristic of the driving element Tr2 has a variation in the photoelectric converting portion 7. In the case in which the normal photoelectric conversion voltage Vcont cannot be obtained corresponding to the magnitude of the photoelectric conversion light Bcont input to the photoelectric converting portion 7, however, a normal brightness cannot be obtained.

More specifically, in the photoelectric converting portion 7, when a conversion gain for converting a light into a voltage is not normal or is varied depending on a pixel position (a conversion gain variation), a normal photoelectric conversion voltage Vcont cannot be obtained or the photoelectric conversion voltage Vcont is varied depending on the pixel position. Even if the characteristic of the driving element Tr2 has no variation, therefore, a pixel current Ioel is varied so that the picture quality of a screen is damaged by a luminance variation.

Embodiment 3 shown in FIG. 8 improves such a drawback.

Detailed description will be given below.

In FIG. 8, a voltage converting portion 50 is provided in the middle of the voltage and current converting portion 5 and the photoelectric converting portion 7 described in Embodiment 1 in FIG. 1. A drain voltage V2 of a driving element Tr2 and an output voltage Vcont of the photoelectric converting portion 7 are input to the voltage converting portion 50.

Figure 9:
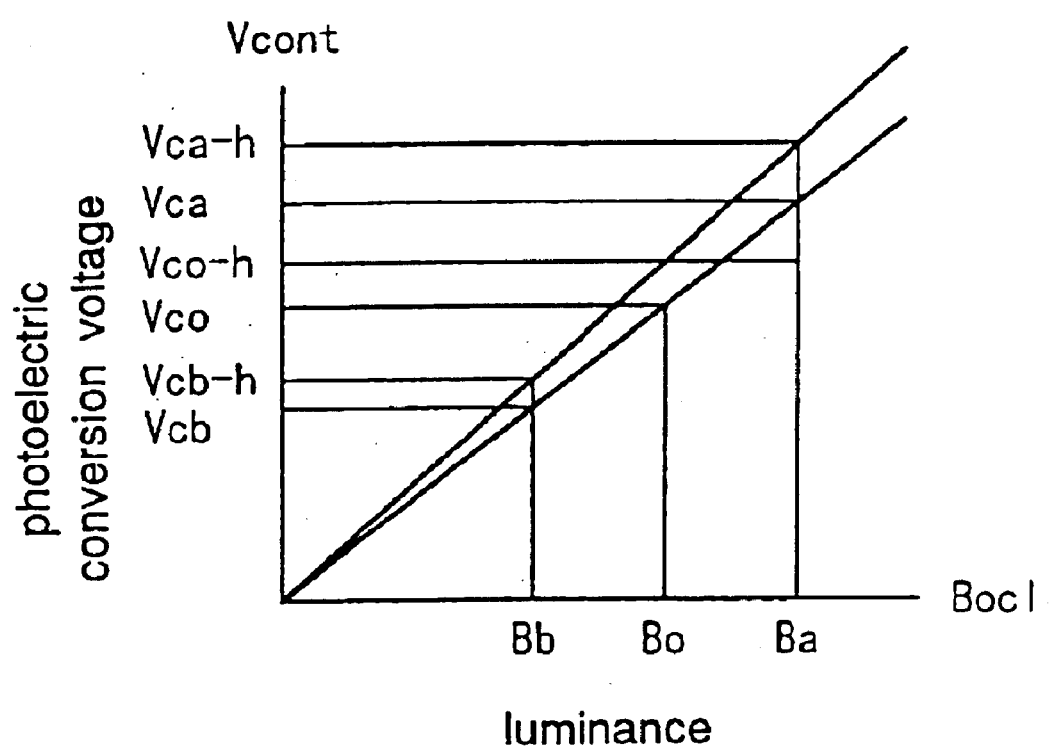
FIG. 9 is a characteristic chart for explaining Embodiment 3 of the present invention, showing the relationship between a photoelectric conversion voltage and luminance in a photoelectric converting portion.

FIG. 9 is a chart for explaining the case in which the conversion gain of the photoelectric converting portion 7 is not normal. If the conversion gain of the photoelectric converting portion 7 is not normal for luminances Ba, Bo and Bb of the light emitting element 6, the value of the output of the photoelectric conversion voltage Vcont is converted into voltage values Vca-h, Vco-h and Vcb-h (normal values are Vca, Vco and Vcb), for example. In Embodiment 3, also in the case in which the photoelectric conversion voltage Vcont is not normal, the voltage converting portion 50 is provided to regulate the gain of the voltage converting portion 50 on the output side, and more specifically, the voltage values Vca-h, Vco-h and Vcb-h are corrected into the conversion voltages Vca, Vco and Vcb. By applying the voltage to the voltage and current convert-ing portion 5, the control current Icont output from the voltage and current converting portion 5 is corrected normally.

In the voltage converting portion 50, the conversion characteristic of the voltage converting portion 50 is designed as shown in FIG. 8 based on the ratio of the magnitudes of the input signal Vcont output from the photoelectric converting portion 7 and the magnitude of a drain voltage V2 in the driving element Tr2 so that the output voltage Vcont of the voltage converting portion 50 can be controlled to have such a value that the photoelectric converting portion 7 is operated normally.

Description will be given to an operation to be carried out in the case in which a variation in the conversion gain of the photoelectric converting portion 7 and a variation in the characteristic of the driving element Tr2 are generated.

(1) The case in which the variation in the conversion gain of the photoelectric converting portion 7 and the variation in the characteristic of the driving element Tr2 are not generated (the case in which the characteristic is normal).

Figure 10:
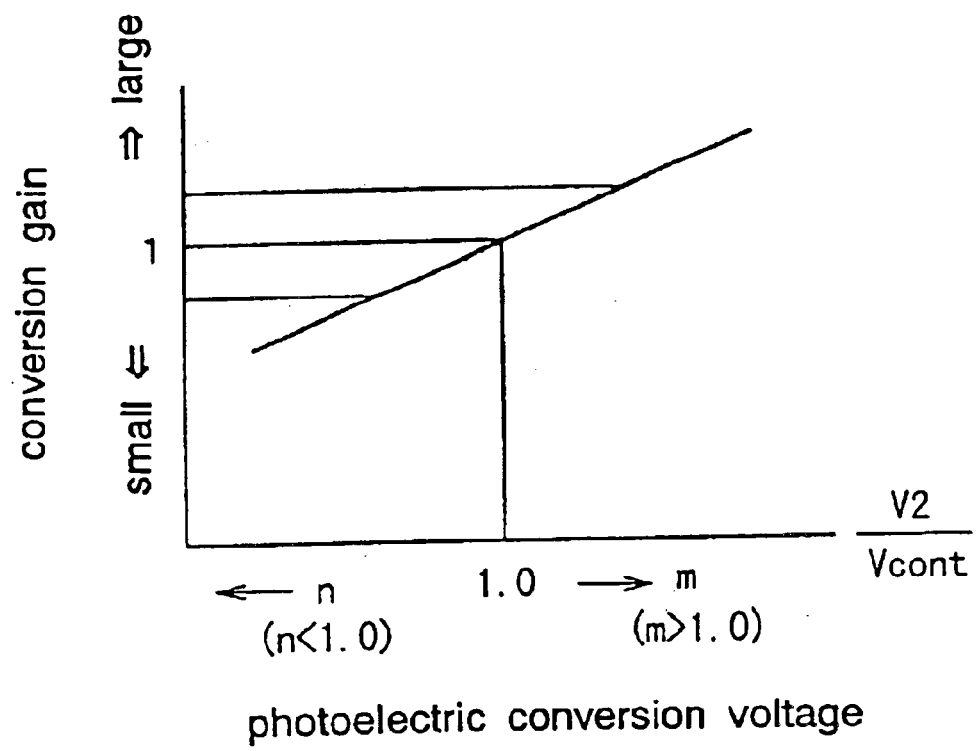
FIG. 10 is a characteristic chart for explaining Embodiment 3 of the present invention, showing the conversion characteristic of the voltage converting portion.

In the case in which the photoelectric converting portion 7 and the driving element Tr2 are operated normally, it is assumed that the drain voltage V2 of the driving element Tr2 input to the voltage converting portion 50 and the output voltage Vcont applied from the photoelectric convertgin portion 7 are equal to each other for convenience to understand the operation. In other words, V2=Vcont is set. Referring to the characteristic shown in FIG. 9, in the case in which the luminance of the light emitting element is Bo, the photoelectric conversion voltage Vcont of the photoelectric converting portion 7 is Vco. As is apparent from FIG. 10, the output voltage Vcont-c of the voltage converting portion 50 has the same value Vco as the output voltage of the photoelectric converting portion 7 because V2/Vcont is 1. The voltage Vcont-c (Vco) is applied to the voltage and current converting portion 5 and the voltage V1 (corresponding to the magnitude of an image signal) is applied to the other input terminal. Since Vco is a normal voltage obtained by a conversion from a light into a voltage corresponding to the magnitude of the voltage V1, a control signal Icont for controlling the luminance of the light emitting element 6 is not output.

(2) The case in which the conversion gain of the photoelectric converting portion 7 is not normal and there is no characteristic variation of the driving element Tr2.

The driving element Tr2 is operated normally. In the case in which the luminance of the light emitting element 6 depending on a drain current corresponding to the voltage V1 applied to the gate voltage of the driving element Tr2 is the luminance Bo shown in FIG. 9, therefore, the conversion gain of the photoelectric converting portion 7 is not normal although the Bcont (Bo) to be an input to the photoelectric converting portion 7 has a normal value. Consequently, an output is not Vco. Referring to FIG. 9, even if a light corresponding to the luminance Bo is incident, an output voltage is Vco-h (Vco-h>Vco). Accordingly, the input of the voltage converting portion 50 has the output voltage Vco-h applied from the photoelectric converting portion 7 and the drain voltage V2 of the driving element Tr2. The relationship between the drain voltage V2 of the driving element Tr2 and the output voltage applied from the photoelectric converting portion 7 has no characteristic variation of the driving element Tr2. As described in the (1), therefore, V2=Vcont, that is, V2=Vco is set and a conversion gain C of the voltage converting portion 50 is set to be 1 or less shown in FIG. 10. When the conversion gain C of the voltage converting portion 50 is designed to have a value of V2=Vco, the value of Vco-h can be converted into Vco. In other words, a conversion voltage Vcont-c output from the voltage converting portion 50 and input to the voltage and current converting portion 5 can be corrected by the voltage converting portion 50 and can be input as a normal voltage value even if the photoelectric converting portion 7 has a variation in the conversion gain or a conversion into a normal value cannot be carried out. Consequently, a voltage V1 (corresponding to the magnitude of an image signal) is applied to one of the input terminals of the voltage and current converting portion 5. Therefore, the Vco applied to the other input side of the voltage and current converting portion 5 is a normal voltage obtained by the conversion from a light corresponding to the magnitude of the voltage V1 into a voltage. For this reason, the control signal Icont for controlling the luminance of the light emitting element 6 is not output (the output value Vco of the voltage converting portion 50 and the control signal Icont for controlling the luminance of the light emitting element 6 are not output to the voltage and current converting portion 5 because the voltage Vco is the normal voltage obtained by the convertion from a light into a voltage depending on the voltage V1 corresponding to the magnitude of the image signal).

(3) The case in which the conversion gain of the photoelectric converting portion 7 is normal and the driving element Tr2 has a variation in a characteristic When the threshold of the driving element Tr2 is varied so that the drain voltage V2 of the driving element Tr2 does not have a normal value, the Bcont (Bo) to be an input to the photoelectric converting portion 7 does not have a normal value. For example, in the case in which the threshold of the driving element Tr2 is normal and a light corresponding to the luminance Bo is incident in FIG. 9, the output voltage Vcont can obtain the Vco and cannot obtain the luminance Bo because the threshold is not the normal value. When the threshold fluctuates, the luminance becomes higher than the Bo and the photoelectric conversion voltage Vco is changed into Vco-h, the output voltage Vco-h and the drain voltage V2 including a variation in the threshold of the driving element Tr2 are applied to the input of the voltage converting portion 50.

Assuming that the photoelectric conversion voltage Vcont output from the photoelectric converting portion 7 is Vco-h, the drain voltage V2 including a variation in the threshold of the driving element Tr2 is set to be V2=Vco-h. Consequently, the output voltage Vcont-c of the voltage converting portion 50 is a value obtained by multiplying the Vco-h to be an input signal by the magnitude of a conversion characteristic (V2/(Vco-h)=1 in FIG. 10).

Accordingly, the voltage V1 corresponding to the magnitude of an image signal and the voltage V2 including the variation information of the threshold of the driving element Tr2 are applied to the input of the voltage and current converting portion 5. Since the threshold of the driving element Tr2 is greater than a normal value and the voltage V1 corresponds to the magnitude of a normal image signal, such a control signal Icont as to cause the luminance of the light emitting element 6 to be normal flows to the current adding and subtracting portion 4. More specifically, the threshold of the driving element Tr2 fluctuates so that the control current Icont flows in such a direction that the Ioel flowing to the light emitting element 6 has a normal value. As a result, the light emitting element 6 emits a light with a normal luminance. When such a control mode is started, the voltage Vcont-c input to the voltage and current converting portion 5 is stabilized in such a state as to be Vco.

(4) The case in which there are both a variation in the conversion gain of the photoelectric converting portion 7 and a variation in the characteristic of the driving element Tr2.

Figure 11:
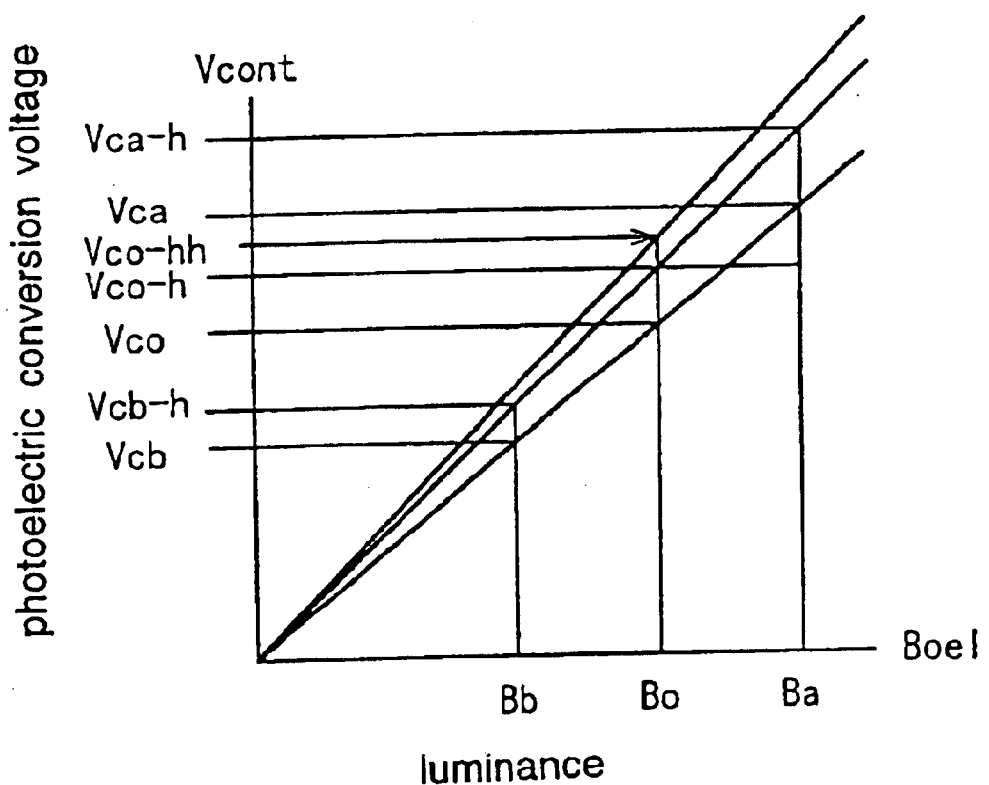
FIG. 11 is a characteristic chart for explaining Embodiment 3 of the present invention, showing the relationship between the photoelectric conversion voltage and the luminance in the photoelectric converting portion.
Figure 12:
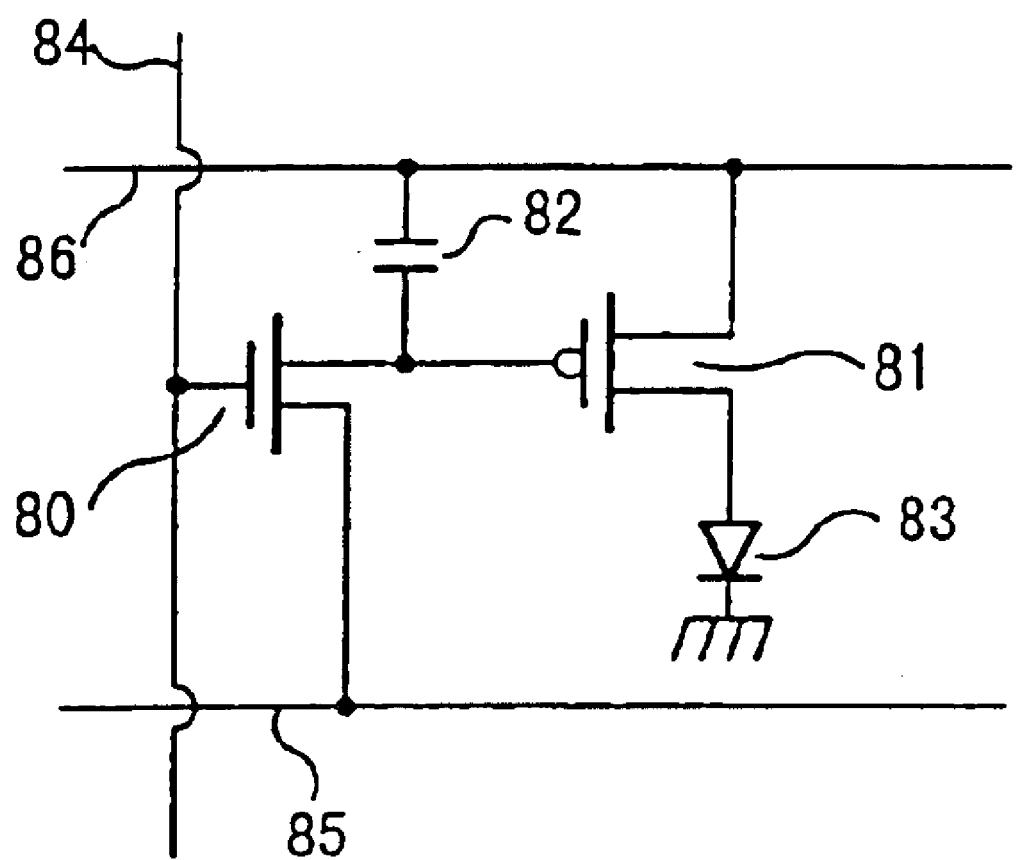
FIG. 12 is a circuit diagram showing a conventional driving circuit.
Figure 13:
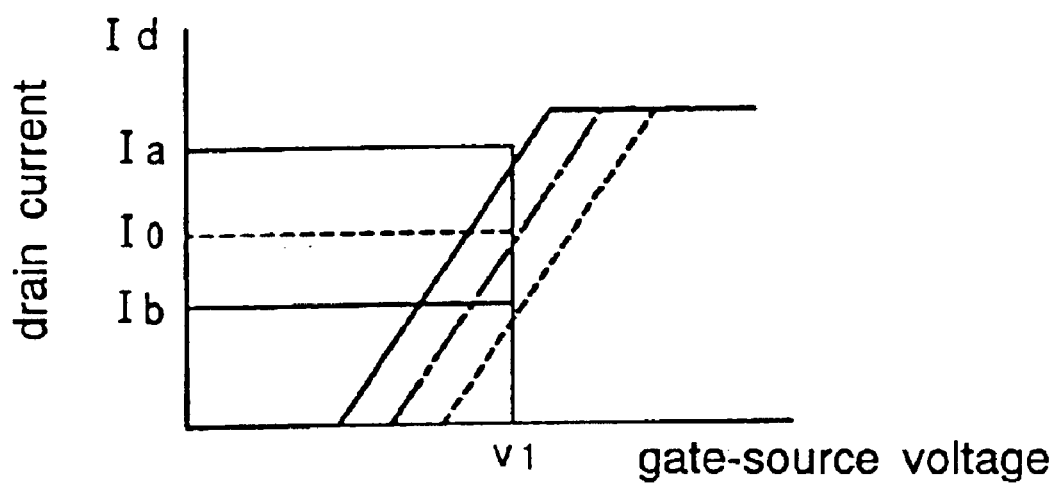
FIG. 13 is a characteristic chart showing the relationship between a drain current and a gate—source voltage of a driving element in the conventional driving circuit.
Figure 14:
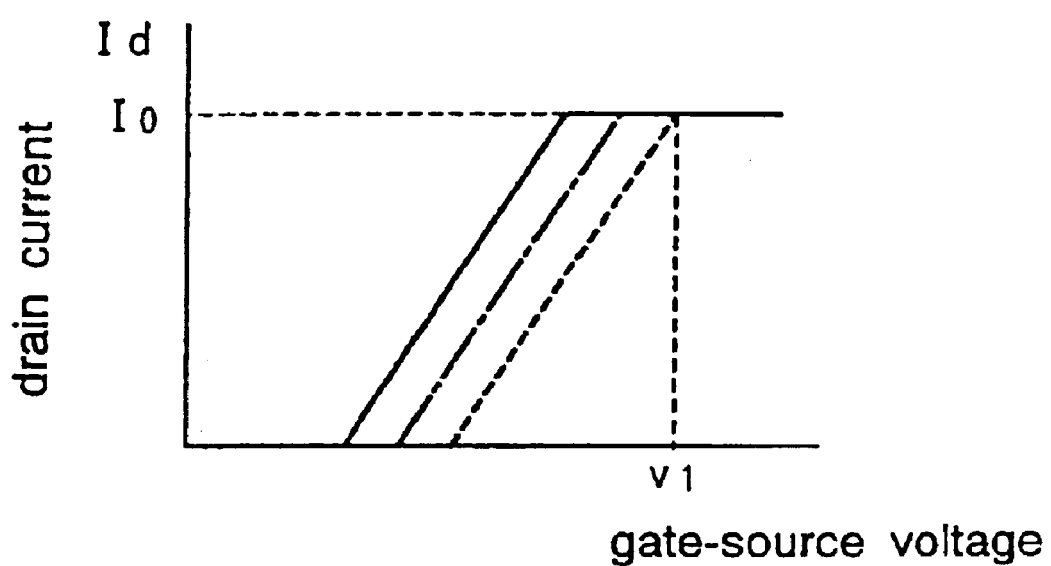
FIG. 14 is a characteristic chart for explaining the relationship between the drain current and the gate—source voltage of the driving element in the conventional driving circuit.
Figure 15:
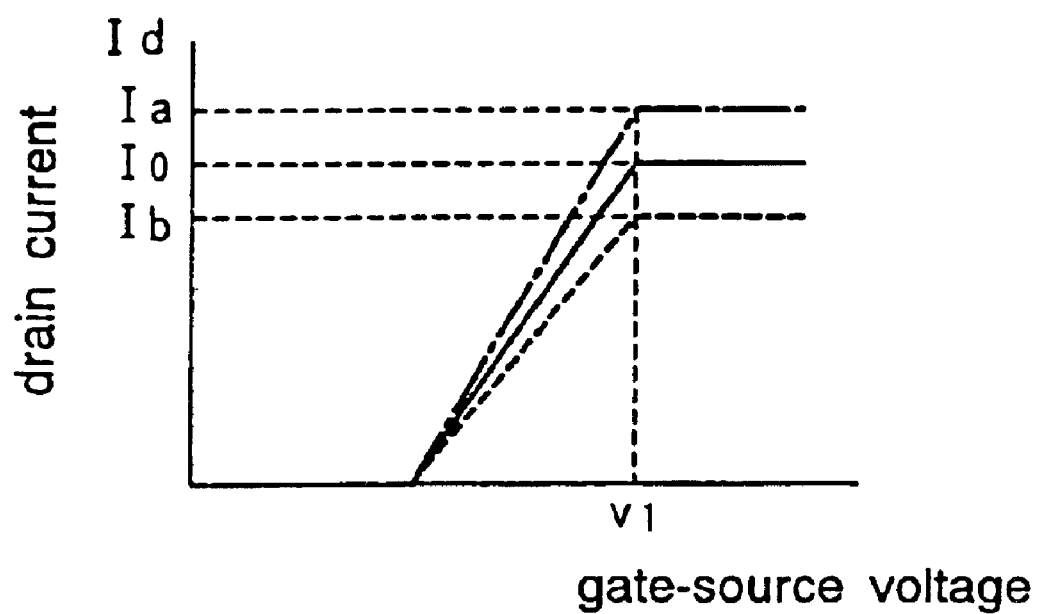
FIG. 15 is a characteristic chart for explaining the relationship between the drain current and the gate—source voltage of the driving element in the conventional driving circuit.
Figure 16:
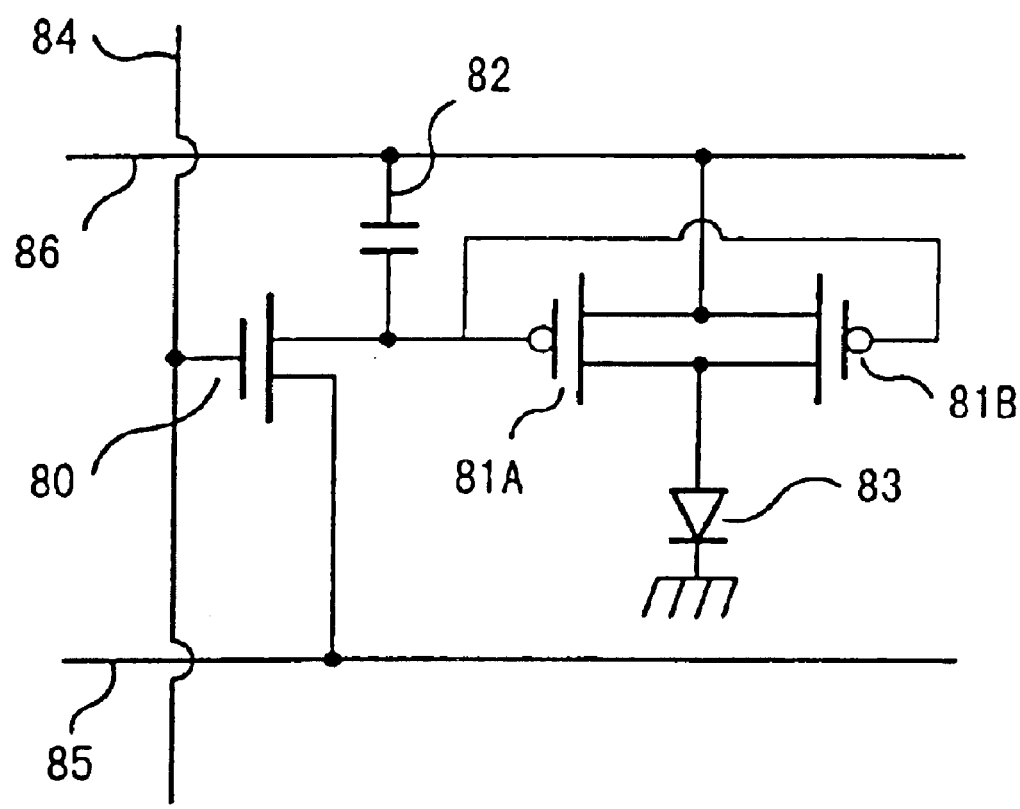
FIG. 16 is a circuit diagram showing the conventional driving circuit.

When the threshold of the driving element Tr2 is varied so that the drain voltage V2 of the driving element Tr2 does not have a normal value, the Bcont (Bo) to be an input to the photoelectric converting portion 7 does not have a normal value. For example, if the threshold of the driving element Tr2 is normal as shown in FIG. 9, the output voltage Vcont can obtain Vco when a light corresponding to the luminance Bo is incident. Since the threshold is not a normal value, however, the luminance Bo cannot be obtained. It will be noted that the threshold of the driving element Tr2 simply fluctuates. In the case in which the conversion gain with the photoelectric converting portion 7 is normal, the, luminance becomes slightly higher than the Bo and the photoelectric conversion voltage Vco is changed into Vco-h. If the conversion gain of the photoelectric converting portion 7 is not normal, however, the photoelectric conversion voltage is Vco-hh as shown in FIG. 11, for example.

Assuming that a value with which the magnitude of the photoelectric conversion voltage Vcont output from the photoelectric converting portion 7 for the photoelectric conversion light Bcont input to the photoelectric converting portion 7 is a magnitude of Vco-h which depends on a variation in the driving element Tr2, the drain voltage V2 including a variation in the threshold of the driving element Tr2 is also set to be V2=Vco-h. Therefore, the output voltage Vcont-c of the voltage converting portion 50 with a variation in the threshold of the driving element Tr2 is a value obtained by multiplying the Vco-h to be an input signal to the voltage converting portion 50 by the magnitude of the conversion characteristic (V2/(Vco-h)=1 in FIG. 10). When the gain is not normal in the photoelectric converting portion 7, however, the output value of the photoelectric converting portion 7 is Vco-hh (Vco-h<Vco-hh) as shown in FIG. 11. However, the relationship between the drain voltage V2 (V2=Vco-h) of the driving element Tr2 and the magnitude of the output voltage Vco-hh applied from the photoelectric converting portion 7 is (Vco-h)/(Vco-hh). Consequently, the conversion gain C of the voltage converting portion 50 is equal to or less than 1. More specifically, by designing the conversion gain C of the voltage converting portion 50 to have such a value, the value of Vco-hh can be converted into Vco-h. In other words, the conversion voltage Vcont-c output from the voltage converting portion 50 and input to the voltage and current converting portion 5 can be input as a voltage value corrected in the voltage converting portion 50 even if the photoelectric converting portion 7 has a variation in the conversion gain or the conversion into a normal value cannot be carried out. Consequently, the voltage V1 (corresponding to the magnitude of an image signal) is applied to the other input terminal of the voltage and current converting portion 5. Therefore, the voltage applied as one of the input sides of the voltage and current converting portion 5 is the voltage V2 including a variation in the threshold of the driving element Tr2, that is, the voltage Vco-h at which the threshold of the driving element Tr2 is greater than a normal value. For this reason, the control signal Icont is output to cause the luminance of the light emitting element 6 to be normal. Even if the threshold of the driving element Tr2 fluctuates and the characteristic variation of the photoelectric converting portion 7 is generated, thus, the control current Icont is caused to flow in such a direction that the Ioel flowing to the light emitting element 6 has a normal value. As a result, the light emitting element 6 emits a light with a normal luminance.

In the Embodiments described above, there is provided means for controlling the output voltage of the voltage converting portion such that the same output voltage and the magnitude of the image signal for controlling the light emitting pixel always correspond to each other with one to one.

While the description has been given by taking the organic EL as an example of the spontaneous light emitting type display element in the above Embodiments, the present invention is not restricted thereto.

INDUSTRIAL APPLICABILITY

The present invention can suppress a fluctuation in the luminance of a light emitting element even if a variation in the current of a driving element, and furthermore, a conversion gain in a photoelectric converting portion for converting a light emitted from the light emitting element fluctuates, and can be effectively utilized for a spontaneous light emitting type display device.

What is claimed is:

1. A spontaneous light emitting display device comprising:
   a plurality of controlled light emitting circuits arranged in a two dimensional array, each controlled light emitting circuit including:
      a light emitting element producing light in response to a driving current;
      a light detecting element detecting the light produced by the light emitting element and generating a photoelectric voltage varying with brightness of the light produced by the light emitting element; and
      a driving circuit receiving the photoelectric voltage produced by the light detecting element and producing a driving current for driving the light emitting element, the driving current varying in response to the photoelectric voltage generated by the light detecting element to compensate for variation in light emission by the light emitting element with respect to the driving current supplied to the light emitting element with reference to a desired characteristic of light emission with respect to driving current.

2. The spontaneous light emitting display device of claim 1, wherein the driving circuit includes
   a voltage and current converting portion and
   a current adding and subtracting portion.

3. The spontaneous light emitting display device of claim 1, wherein the device further includes
   a voltage converting portion on an output side of the light detecting element, and
   means for controlling current flowing to the light emitting element in response to the voltage produced by the voltage converting portion.

4. The spontaneous light emitting display device of claim 3, wherein the device further includes means for controlling output voltage of the voltage converting portion such that magnitudes of the output voltage and an image signal for controlling the light emitting element correspond to each other, one-to-one.

* * * * *